US012798123B2

(12) United States Patent
Kitamura et al.

(10) Patent No.: US 12,798,123 B2
(45) Date of Patent: Nov. 17, 2026

(54) LIFTING HEAD AND LIFTING DEVICE

(71) Applicant: TORAY ENGINEERING CO., LTD., Tokyo (JP)

(72) Inventors: Ken Kitamura, Otsu (JP); Masafumi Senda, Otsu (JP); Tomonori Kawamura, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 267 days.

(21) Appl. No.: 18/850,612

(22) PCT Filed: Mar. 22, 2023

(86) PCT No.: PCT/JP2023/011096

§ 371 (c)(1),
(2) Date: Sep. 25, 2024

(87) PCT Pub. No.: WO2023/189887

PCT Pub. Date: Oct. 5, 2023

(65) Prior Publication Data

US 2025/0205907 A1 Jun. 26, 2025

(30) Foreign Application Priority Data

Mar. 29, 2022 (JP) ................................ 2022-054523

(51) Int. Cl.
*B25J 15/06* (2006.01)
*B25J 11/00* (2006.01)
(Continued)

(52) U.S. Cl.
CPC ....... *B25J 15/0641* (2013.01); *B25J 11/0095* (2013.01); *B25J 15/04* (2013.01); *H10P 72/0442* (2026.01); *H10P 72/78* (2026.01)

(58) Field of Classification Search
CPC ...... H10P 72/0442; H10P 72/00; H10P 72/78; H10P 72/7612; B25J 15/04; B25J 11/0095; B25J 15/0641
See application file for complete search history.

(56) References Cited

U.S. PATENT DOCUMENTS 4,850,780 A * 7/1989 Safabakhsh .......... H05K 13/021
414/416.1
6,204,092 B1 * 3/2001 Freund ............... H10P 72/0442
438/464
(Continued)

FOREIGN PATENT DOCUMENTS

CN 207690766 U 8/2018
JP 2008-117806 A 5/2008
(Continued)

OTHER PUBLICATIONS

International Search Report of the corresponding International Application No. PCT/JP2023/011096, dated Jun. 6, 2023.

*Primary Examiner* — Michael A Riegelman
(74) *Attorney, Agent, or Firm* — Spencer Fane LLP

(57) ABSTRACT

A lifting head comprises a base member that has a suctioned surface, a raising/lowering shaft supported by the base member and having a raising/lowering axial channel, a contact member fixed to one end of the raising/lowering shaft and contacting with a raising/lowering drive mechanism of a lifting device, a needle support member fixed to the other end of the raising/lowering shaft and supporting a needle, and a needle cap having a stage at one end thereof and fixed to the base member. The suctioned surface of the base member is gripped by a suction force of a first negative pressure passage of an attachment member of the lifting device. While the contact member contacts with the raising/lowering drive mechanism, an inside of the needle cap is suctioned by a suction force of a second negative pressure
(Continued)

passage of the raising/lowering drive mechanism via the raising/lowering axial channel.

14 Claims, 6 Drawing Sheets

(51) Int. Cl.

| | |
|---|---|
| ***B25J 15/04*** | (2006.01) |
| ***H10P 72/00*** | (2026.01) |
| ***H10P 72/78*** | (2026.01) |

(56) References Cited

U.S. PATENT DOCUMENTS 8,142,611 B2 * 3/2012 Shibata ............... H10P 72/0442 156/247
8,470,130 B2 * 6/2013 Chong .................... H10P 72/04 156/707
10,410,905 B1 * 9/2019 Peterson ............. H10P 72/0442
12,381,099 B2 * 8/2025 Lee ..................... H10P 72/0442
12,685,070 B2 * 7/2026 Yan ..................... H10P 72/0442
2004/0115904 A1 * 6/2004 Cheung ............... H10P 72/0428 438/464
2009/0193916 A1 * 8/2009 Watanabe ........... F16H 25/2021 74/216.3
2011/0088845 A1 * 4/2011 Chong .................... H10P 72/04 156/761
2022/0352003 A1 * 11/2022 Jin ....................... H05K 7/1084
2022/0415702 A1 * 12/2022 Drewery ........... H01J 37/32623
2024/0312808 A1 * 9/2024 Yan ..................... H10P 72/0442
2025/0205907 A1 * 6/2025 Kitamura ............. B25J 11/0095
2025/0266278 A1 * 8/2025 Hirai ....................... H10P 72/50

FOREIGN PATENT DOCUMENTS

JP 2013-172122 A 9/2013
JP 2020-47759 A 3/2020
JP 2021-158166 A 10/2021
WO 2021/129053 A1 7/2021

* cited by examiner

LIFTING HEAD AND LIFTING DEVICE

CROSS-REFERENCE TO RELATED APPLICATIONS

This application is a U.S. National stage of International Application No. PCT/JP2023/011096 filed on Mar. 22, 2023. This application claims priority to Japanese Patent Application No. 2022-054523 filed on Mar. 29, 2022 with Japan Patent Office.

BACKGROUND

Field of the Invention

The present invention relates to a lifting head and a lifting device that lift at least one of a plurality of chips divided into a prescribed shape on a holding sheet.

Background Information

In a process of dividing a semiconductor wafer into a prescribed shape to form semiconductor chips, the semiconductor wafer is divided into semiconductor chips of the prescribed shape in a state of being attached to a holding sheet. The divided semiconductor chip needs to be individually detached from the holding sheet in order to carry out processing, such as wiring onto a substrate. In this scenario, a lifting head is known, which lifts one semiconductor chip to be detached from the holding sheet side to detach the semiconductor chip from the holding sheet. The lifting head lifts a prescribed semiconductor chip using a needle corresponding to the size of the semiconductor chip, in a state in which the holding sheet, to which the semiconductor chip is attached, is suctioned and held. As a result, the lifting head is able to move, in the lifting direction, only the prescribed semiconductor chip, which is surrounded by other semiconductor chips without any gaps.

In such a lifting head, the position of the needle that lifts the semiconductor chip must be changed for each type of semiconductor chip. Therefore, in order to accommodate changes in the semiconductor chip type, the lifting head is configured such that a needle cap that has a stage that uses suction to hold a holding sheet can be removed to move the position of the needle. Incidentally, in order to accommodate the diversification of electronic devices, semiconductor chips are produced in small quantities but in a variety of types. Therefore, the lifting head needs to change the position of the needle in accordance with changes in the type of the semiconductor chip. In order to quickly respond to such frequent changes in type, a lifting head is known in which the needle cap, and a needle holding member that holds the needle and that can be raised and lowered, constitute a single unit that can be attached to/detached from a semiconductor manufacturing apparatus. For example, refer to Japanese Laid-Open Patent Application Publication No. 2013-172122 (Patent Document 1).

The lifting head disclosed on Patent Document 1 comprises an adapter that is connected to a housing of a semiconductor manufacturing apparatus, a lifting shaft that is held by the adapter so as to be movable in an axial direction, a support member that is connected to the lifting shaft, a lifting pin that is supported by the support member, and a dome that covers the support member and the lifting pin. The lifting head is replaced as a single unit in which the dome is fixed to the adapter in which the lifting pin is positioned. While the lifting head is being held by the housing, the inside of the dome is suctioned through a vacuum port inside the adapter.

SUMMARY

The lifting head of Patent Document 1 is fitted into the housing by a replacement arm of the semiconductor manufacturing apparatus. The lifting head is coupled by a protrusion provided in the housing engaging with a recess provided on the lifting head. Accordingly, there will be play between the lifting head and the housing that corresponds to the gap between the protrusion and the recess. In addition, in order to make the lifting head attachable to/detachable from the housing with the replacement arm, an opening of the vacuum port is coupled with an opening of a vacuum port on the housing side to allow communication therebetween. Thus, there is the possibility that the lifting head would move slightly inside the housing due to the effect of air that leaks from the coupled vacuum port portion caused by fluctuations in the negative pressure inside the dome.

An object of the present disclosure is to provide a lifting head and a lifting device that make it possible to maintain the position of a needle positioned on the lifting device in a readily detachable state.

The present inventors considered configurations that would make it possible to maintain the position of a needle positioned in a lifting device in an easily-detachable state, in a lifting head and a lifting device of the lifting head, said lifting head configured to lift, with the needle, at least one of a plurality chips attached to a holding sheet, in a chip lifting device included in a semiconductor manufacturing apparatus. As a result of extensive investigation, the present inventors conceived of the following configuration.

The lifting head according to one embodiment of the present disclosure is a lifting head that lifts, with a needle, at least one of a plurality chips attached to a holding sheet, in a lifting device included in a semiconductor manufacturing apparatus.

The lifting head comprises: a base member that is configured to be detachable with respect to an attachment member of the lifting device and that has a suctioned surface that is gripped onto the attachment member; a raising/lowering shaft that is supported by the base member in a state of being movable in an axial direction as well as being rotationally fixed about the axis, and that has a raising/lowering axial channel that communicates from one end to another end in the axial direction; a contact member that is fixed to one end of the raising/lowering shaft in a state in which the raising/lowering axial channel is in communication with the outside, and that comes in contact with, from a raising/lowering direction, a push-up member of a raising/lowering drive mechanism of the lifting device; a needle support member that is fixed to the other end of the raising/lowering shaft in a state in which the raising/lowering axial channel is in communication with the outside, and that supports the needle in the axial direction so as to be detachable; and a needle cap, which is a tubular member having, at one end thereof, a stage on which the holding sheet is placed and to which is provided a through-hole through which the needle is inserted, and the other end thereof is fixed to the base member so that, when the needle support member and the needle are located therein, the through-hole overlaps with the needle when viewed in the axial direction.

The suctioned surface of the base member is gripped by a suction force of a first negative pressure passage of the attachment member in a state in which the base member is positioned on the attachment member. When the contact member comes in contact with the raising/lowering drive mechanism, the inside of the needle cap is gripped by a suction force of a second negative pressure passage of the raising/lowering drive mechanism via the raising/lowering axial channel.

In the configuration described above, the lifting head is configured as a single unit in which a raising/lowering shaft, a needle support member that is fixed to the raising/lowering shaft, a needle that is supported by the needle support member, and a needle cap that has a stage, are supported by a base member. In addition, the lifting head does not move relative to the attachment member because the base member is gripped onto the attachment member by the suction force of the first negative pressure passage provided in the attachment member of the lifting device. Furthermore, in the lifting head, the inside of the needle cap is gripped by the suction force of the second negative pressure passage of the raising/lowering drive mechanism of the lifting device. That is, the lifting head is configured such that gripping of the base member and the suctioning inside the needle cap are respectively carried out by the suction forces of different negative pressure passages. Therefore, fluctuations in the negative pressure inside the needle cap of the lifting head do not affect the gripping state of the base member. As a result, it is possible to maintain the position of the needle positioned relative to the lifting device in a readily detachable state.

According to another aspect, the lifting head of the present disclosure preferably includes the following configuration. A tubular suction elastic member that communicates with the raising/lowering axial channel is fixed to the raising/lowering shaft or the contact member. The suction elastic member communicates with the second negative pressure passage when the contact member comes in contact with a push-up member of the raising/lowering drive mechanism.

In the configuration described above, when the base member is attached to the attachment member of the lifting device, the second negative pressure passage of the raising/lowering drive mechanism and the raising/lowering axial channel of the raising/lowering shaft are placed in communication with each other by the suction elastic member. The suction elastic member is composed of an elastic body, such as rubber, and therefore grips the raising/lowering drive mechanism by the suction force of the second negative pressure passage. That is, the suction elastic member can prevent leakage from the connection portion between the second negative pressure passage and the raising/lowering axial channel of the raising/lowering shaft. On the other hand, the suction elastic member will not grip the raising/lowering drive mechanism by making the pressure inside the second negative pressure passage positive. As a result, it is possible to maintain the position of the needle positioned relative to the lifting device in a readily detachable state.

According to another aspect, the lifting head of the present disclosure preferably includes the following configuration. The lifting head comprises a pressing elastic member that presses the contact member against the push-up member of the raising/lowering drive mechanism. The contact member is pressed against the push-up member of the raising/lowering drive mechanism by the elastic member.

In the configuration described above, a force is constantly applied to the contact member of the lifting head by the pressing elastic member, composed of a spring or the like, pressing the contact member against the raising/lowering drive mechanism. Thus, even when the contact member of the lifting head is raised or lowered by the raising/lowering drive mechanism, the contact member does not separate from the push-up member of the raising/lowering drive mechanism. That is, the lifting head can prevent leakage from the connection portion between the second negative pressure passage and the raising/lowering axial channel of the raising/lowering shaft. In addition, the pressing elastic member applies force in a direction in which the base member of the lifting head moves away from the attachment member of the lifting device. As a result, it is possible to maintain the position of the needle positioned relative to the lifting device in a readily detachable state.

According to another aspect, the lifting head of the present disclosure preferably includes the following configuration. The base member has an arm engagement portion that engages with a replacement arm of the lifting device.

In the configuration described above, the lifting head is transported in a state in which the replacement arm of the lifting device is engaged with the arm engagement portion. Therefore, the lifting head does not move relative to the replacement arm during transportation. As a result, it is possible to maintain the position of the needle positioned relative to the lifting device in a readily detachable state.

A lifting device according to one embodiment of the present disclosure is a lifting device of the lifting head described above. The lifting device comprises an attachment member to which the lifting head is attached so as to be detachable, a raising/lowering drive mechanism that raises/lowers a contact member of the lifting head, and a lifting head replacement mechanism that attaches/detaches the lifting head to/from the attachment member.

The attachment member has a first negative pressure passage that is suctioned by a vacuum source. When a base member of the lifting head is attached to the attachment member, the attachment member suctions a suctioned surface of the base member with the suction force of the first negative pressure passage. The raising/lowering drive mechanism has a push-up member that pushes up a contact member of the lifting head and a second negative pressure passage that is suctioned by a vacuum source. When the contact member of the lifting head comes in contact with the push-up member, the raising/lowering drive mechanism suctions the inside of a needle cap of the lifting head with the suction force of the second negative pressure passage via the raising/lowering axial channel of the lifting head.

In the configuration described above, the lifting device grips the suctioned surface of the base member of the lifting head with the suction force of the first negative pressure passage of the attachment member. Furthermore, the lifting device suctions the inside of the needle cap in the lifting head with the second negative pressure passage of the raising/lowering drive mechanism. Therefore, the lifting device grips the base member and suctions the inside the lifting head through different passages, so neither is affected by fluctuations in the negative pressure. As a result, it is possible to maintain the position of the needle positioned relative to the lifting device in a readily detachable state.

According to another aspect, the lifting device of the present disclosure preferably includes the following configuration. In the raising/lowering drive mechanism, a tubular suction elastic member that communicates with the second negative pressure passage is fixed to an opening of the second negative pressure passage. The suction elastic member communicates with the raising/lowering axial channel of the lifting head when the contact member of the lifting head comes in contact with the push-up member.

In the configuration described above, in the lifting device, when the base member of the lifting head is attached to the attachment member, the second negative pressure passage of the raising/lowering drive mechanism and the raising/lowering axial channel of the raising/lowering shaft are placed in communication with each other by the suction elastic member. The suction elastic member is composed of an elastic body, such as rubber, and therefore comes in close contact with the raising/lowering shaft or the contact member of the lifting head by the suction force in the second negative pressure passage. That is, the suction elastic member can prevent leakage from the connection portion between the second negative pressure passage and the raising/lowering axial channel of the raising/lowering shaft. On the other hand, the suction elastic member will not come in close contact with the lifting head by making the pressure inside the second negative pressure passage positive. At this time, the lifting device does not raise and lower the lifting head with the suction elastic member, but rather by bringing the push-up member, which is a rigid body, in contact with the contact member of the lifting head. Thus, the lifting device can ensure reproducibility of the raised position of the needle. As a result, it is possible to maintain the position of the needle positioned relative to the lifting device in a readily detachable state.

According to another aspect, the lifting device of the present disclosure preferably includes the following configuration. The lifting head replacement mechanism has a plurality of replacement arms, the plurality of replacement arms respectively hold the lifting heads, and, of the lifting heads respectively held by the plurality of replacement arms, a replacement arm holding a selected lifting head is used to attach the selected lifting head onto the attachment member, and a lifting head attached to the attachment member is removed with a corresponding replacement arm.

In the configuration described above, in the lifting device, the plurality of replacement arms of the lifting head replacement mechanism respectively hold the lifting heads corresponding to different types of chips. The lifting device is able to adjust the pressure of the first negative pressure passage and the second negative pressure passage to automatically attach/detach, using the replacement arms, any one of the lifting heads held by the plurality of replacement arms to/from the attachment member. As a result, it is possible to maintain the position of the needle positioned relative to the lifting device in a readily detachable state.

The technical language used in the present disclosure is used only for the purpose of defining specific embodiments and is not intended to limit the present disclosure with the technical language.

In the present disclosure, use of the terms “including,” “comprising,” “having,” and variants thereof specifies the presence of the indicated features, steps, elements, components, and/or equivalents thereof, but may include one or more of the steps, operations, elements, components, and/or groups thereof.

In the present disclosure, the terms “attached,” “connected,” “coupled,” and/or equivalents thereof are used in the broad senses thereof, and encompass both “direct and indirect” attachment, connection, and coupling. Further, “connected” and “coupled” are not limited to a physical or mechanical connection or coupling, and may encompass direct or indirect, electrical connection or coupling.

Unless otherwise defined, all terms (including technical terms and scientific terms) used in the present disclosure have the same meanings as meanings commonly understood by a person skilled in the art of the technical field to which the present disclosure belongs.

(Semiconductor Chip)

In the present disclosure, a semiconductor chip refers to a single cut piece obtained by dicing a disk-shaped semiconductor wafer, on which circuit patterns have been imprinted, into a grid-like pattern. The cut semiconductor chip is transported in a state of being attached to a holding sheet. A plurality of semiconductor chips are positioned so as to be adjacent to each other without any gaps therebetween.

(Holding Sheet)

In the present disclosure, a holding sheet refers to a sheet for stably transporting the semiconductor chip that has been cut. The holding sheet is made of a resin film. An adhesive substance is applied to one surface of the holding sheet. A plurality of semiconductor chips are adhered, in a detachable manner, onto the surface of the holding sheet to which the adhesive substance is applied.

According to the lifting head and lifting device according to one embodiment of the present disclosure, it is possible to maintain the position of the needle positioned relative to the lifting device in a readily detachable state.

DETAILED DESCRIPTION OF EMBODIMENTS

Figure 1:
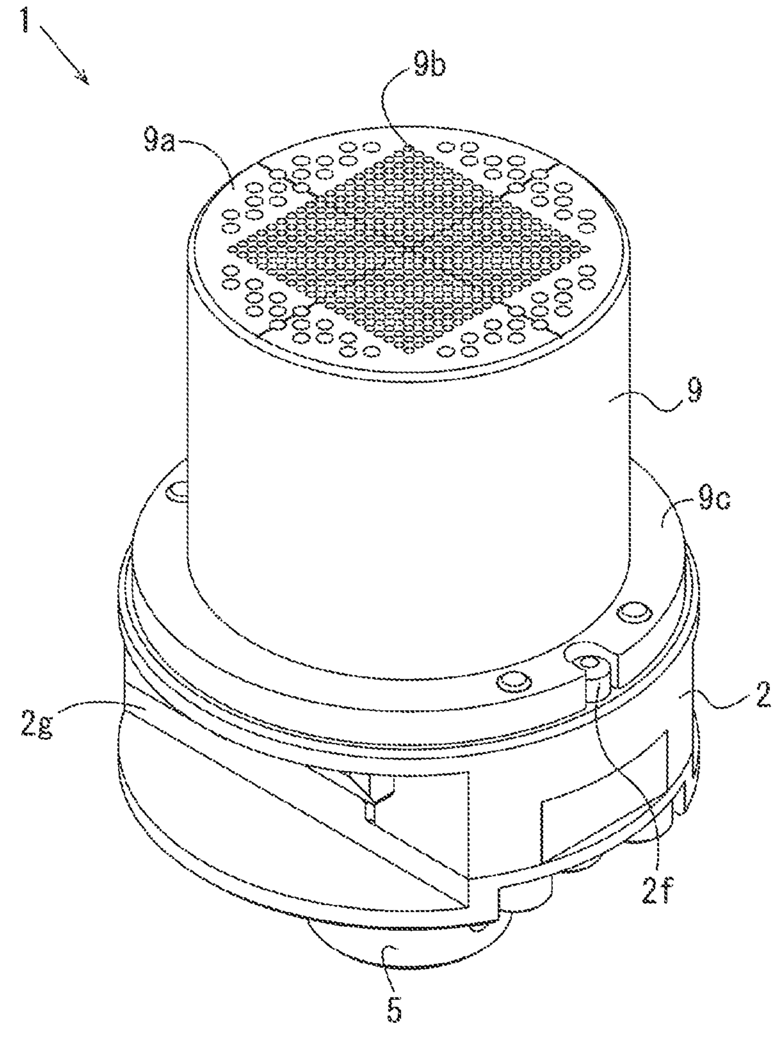
FIG. 1 is a perspective view of a lifting head according to an embodiment of the present disclosure.

An exemplary embodiment of the present disclosure will be described in detail below, with reference to the drawings. Identical or corresponding parts in the drawings have been assigned the same reference numerals, and explanations thereof are not repeated. In addition, the dimensions of the component members in the drawings do not faithfully represent the actual dimensions of the component members or the dimensional ratios of each component member. In the explanation of the lifting head 1, which is an exemplary embodiment of the present disclosure, the direction parallel to the axis of the raising/lowering shaft is referred to as the “raising/lowering direction,” “up-down direction,” or the “Z direction,” the two directions that are perpendicular to the axis of the raising/lowering shaft and that are perpendicular to each other are referred to as “X direction” and the “Y direction," and the rotation direction around the axis of the raising/lowering shaft is referred to as the "circumferential direction." However, definitions of these directions are not intended to limit the orientation of the lifting head 1 during use.

(Lifting Head 1)

Figure 2:
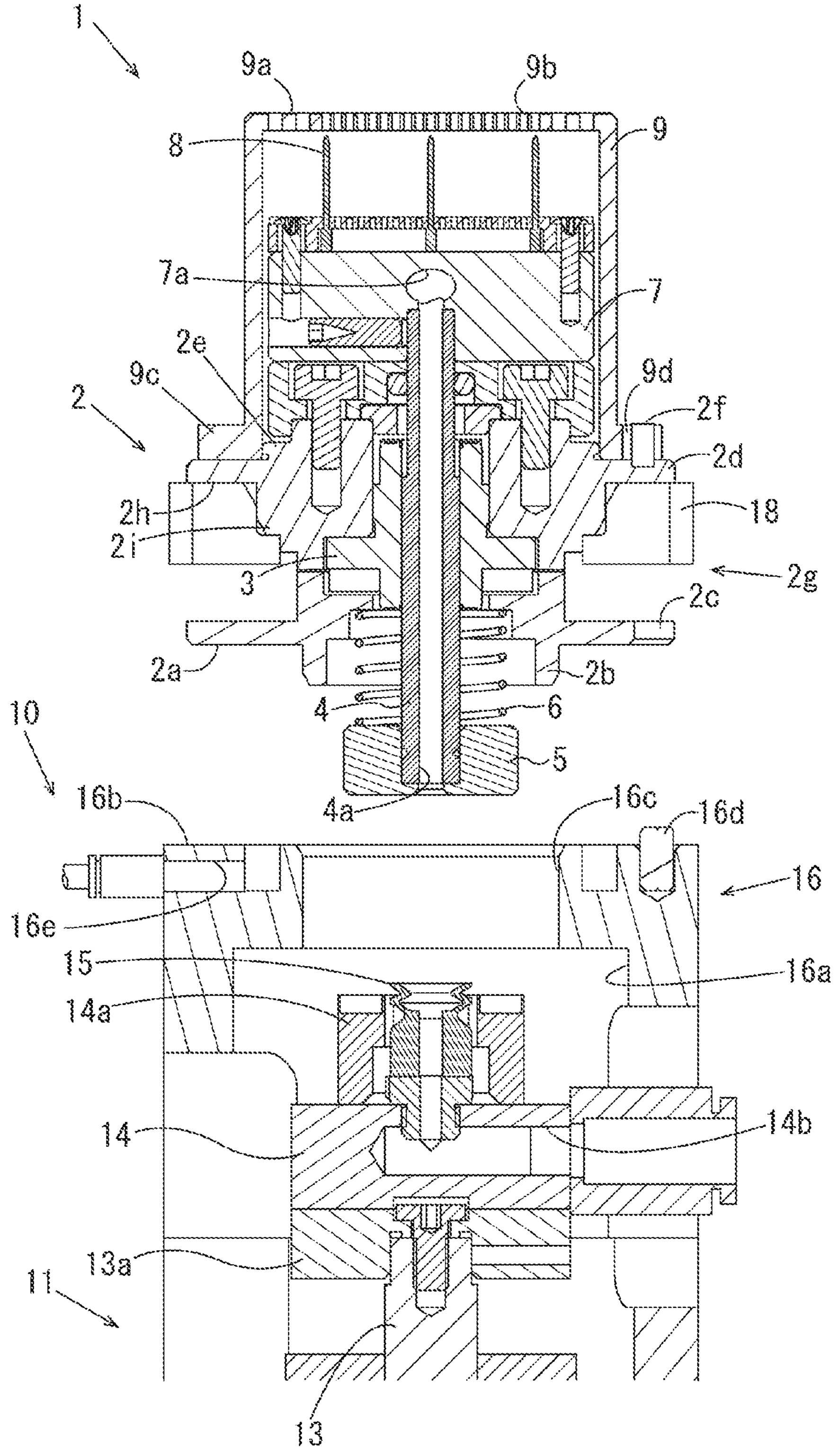
FIG. 2 is a cross-sectional view of the lifting head and a lifting device according to the embodiment of the present disclosure as viewed from a direction perpendicular to the raising/lowering direction.

The lifting head 1, which lifts at least one semiconductor chip C (refer to FIG. 3) will be described, with reference to FIGS. 1 and 2. FIG. 1 is a perspective view of the lifting head 1. FIG. 2 is a cross-sectional view of the lifting head 1 and a lifting device 10 as viewed from a direction perpendicular to the raising/lowering direction.

Figure 3:
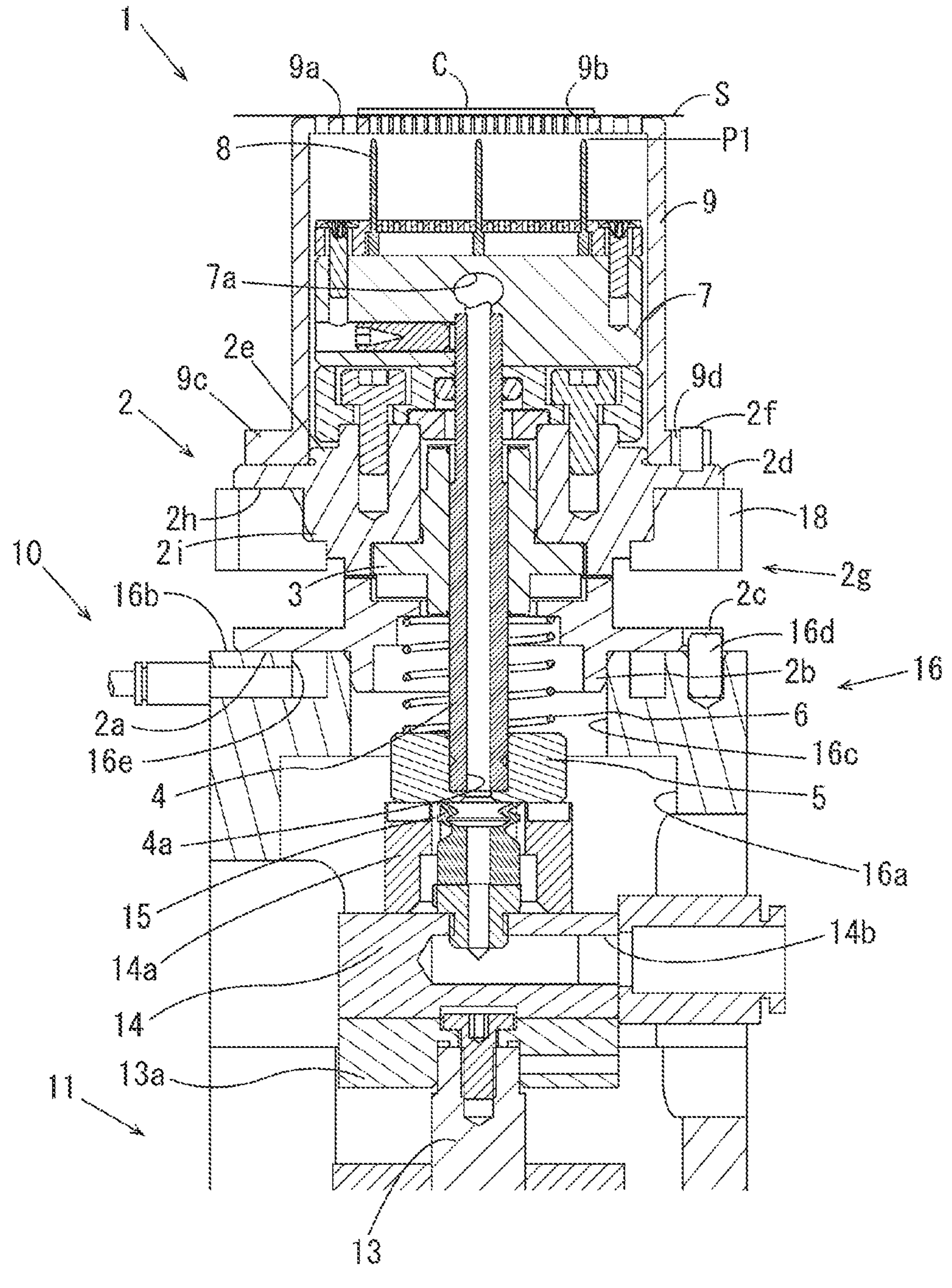
FIG. 3 is a cross-sectional view of the lifting head and the lifting device according to the embodiment of the present disclosure, in a state in which a needle of the lifting head is positioned at a lowered position, as viewed from a direction perpendicular to the raising/lowering direction.

As shown in FIGS. 1 and 2, the lifting head 1 is a jig that lifts up a given semiconductor chip C from a plurality of semiconductor chips C attached to a holding sheet S (refer to FIG. 3). The lifting head 1 is attached to the lifting device 10 so as to be detachable (refer to FIG. 2). The lifting head 1 comprises a base member 2, a spline nut 3, a spline shaft 4, a contact member 5, a compression spring 6, a needle support member 7, needles 8, and a needle cap 9.

As shown in FIG. 2, the base member 2 is a member that is fitted into an attachment member 16 of the lifting device 10. The base member 2 is a hollow cylindrical member. One end surface of the base member 2 constitutes a suctioned surface 2*a* that is gripped onto the attachment member 16 of the lifting device 10. In addition, one end surface of the base member 2 has a cylindrical base member fitting portion 2*b* that protrudes in the axial direction. The base member fitting portion 2*b* is configured to be attachable to/detachable from a base member fitting hole 16*c* of the attachment member 16. The base member fitting portion 2*b* that is fitted into the base member fitting hole 16*c* determines the position of the base member 2 in the X direction and the Y direction with respect to the attachment member 16. Furthermore, one end surface of the base member 2 is provided with a base member positioning pin groove 2*c* that extends in the radial direction. The base member positioning pin groove 2*c* is configured such that a base member positioning pin 16*d* of the attachment member 16 can be attached thereto/detached therefrom. The circumferential position of the base member 2 with respect to the attachment member 16 is determined by the base member positioning pin groove 2*c* into which the base member positioning pin 16*d* is fitted.

The other end surface of the base member 2 constitutes an attachment surface 2*d* to which the needle cap 9 is fixed. In addition, the other end surface of the base member 2 has an annular needle cap fitting portion 2*e* that protrudes in the axial direction. The needle cap fitting portion 2*e* is configured such that the needle cap 9 can be attached thereto/detached therefrom. The center of the needle cap fitting portion 2*e* overlaps with the center of the base member fitting portion 2*b* when viewed in the axial direction. That is, the needle cap fitting portion 2*e* is configured to be concentric with the base member fitting portion 2*b* when viewed in the axial direction. In the base member 2, the position of the needle cap 9 in the X direction and the Y direction with respect to the base member 2 is determined by the needle cap fitting portion 2*e* that fits into the needle cap 9. Furthermore, the attachment surface 2*d* of the base member 2 has a needle cap positioning pin 2*f*. The needle cap positioning pin 2*f* is configured to be attachable to/detachable from a needle cap positioning pin groove 9*d* of the needle cap 9. In the base member 2, the circumferential position of the needle cap 9 with respect to the base member 2 is determined by the needle cap positioning pin 2*f* that fits into the needle cap positioning pin groove 9*d*.

The base member 2 has an arm engagement portion 2*g* with which a replacement arm 18 of the lifting device 10 engages. The arm engagement portion 2*g* is the portion with which the replacement arm 18 of the lifting device 10 engages. The arm engagement portion 2*g* is configured by forming recesses in the radial direction in portions of the outer circumferential surface of the base member 2 that face each other across the axis of the base member 2. A side surface of the arm engagement portion 2*g* on the needle cap 9 side, which is the upper side surface, is configured as a replacement arm contact surface 2*h* with which the upper surface of the replacement arm 18 comes into contact. The base member 2 is held by the replacement arm 18 by the upper surface of the replacement arm 18 coming in contact with the replacement arm contact surface 2*h* from below. In addition, the arm engagement portion 2*g* has a pair of projecting portions 2*i* at positions facing each other across the axis. The pair of projecting portions 2*i* are configured to engage with the replacement arm 18. The base member 2 is configured to be capable of being held by the replacement arm 18 in a state in which the movement thereof in the X direction and the Y direction with respect to the replacement arm 18 is restricted by the replacement arm contact surface 2*h* and the projecting portions 2*i*.

The spline nut 3 is a component that supports the spline shaft 4, which is the raising/lowering shaft, so as to be movable in the axial direction and to be immovable around the axis. The spline nut 3 supports the spline shaft 4 via undiagrammed rolling elements. The spline nut 3 is fixed inside the base member 2 such that the axis of the spline shaft 4, which the spline nut 3 supports, coincides with the axis of the base member 2. That is, the spline shaft 4 is supported by the base member 2 at the center of the base member 2 so as to be movable up and down in the axial direction, and to be rotationally fixed around the axis. The spline shaft 4 is a hollow shaft having a raising/lowering axial channel 4*a* that extends in the axial direction and that communicates from one end to the other end.

The contact member 5 is a member that comes in contact with the raising/lowering drive mechanism 11 in the lifting device 10. The contact member 5 is a disk-shaped member having a larger outer diameter than the outer diameter of the spline shaft 4. The contact member 5 is fixed to one end of the spline shaft 4 on the lifting device 10 side. In addition, the contact member 5 is positioned on the lifting device 10 side of the base member 2. The spline shaft 4 passes through the contact member 5. That is, the contact member 5 does not block the raising/lowering axial channel 4*a* of the spline shaft 4. An end surface of the contact member 5 is configured so as to be capable of coming in contact with a push-up member 14 of the raising/lowering drive mechanism 11.

The compression spring 6, which is a pressing elastic member, is an elastic member that presses the contact member 5 against the push-up member 14 of the raising/lowering drive mechanism 11. The compression spring 6 is positioned between the base member 2 and the contact member 5. One end of the compression spring 6 is in contact with the contact member 5. The other end of the compression spring 6 is in contact with the base member 2. The compression spring 6 applies a force to the base member 2 for pressing the contact member 5 toward the raising/lowering drive mechanism 11 of the lifting device 10, in a state in which the gap between the base member 2 and the contact member 5 is smaller than the natural length of the spring 6.

The needle support member 7 is a member that supports the needles 8 in a prescribed arrangement. The needle support member 7 is a columnar member having an outer diameter that is larger than the outer diameter of the spline shaft 4 and smaller than the inner diameter of the needle cap 9. The needle support member 7 is fixed to the other end of the spline shaft 4 on the needle cap 9 side. The other end of the spline shaft 4 is inserted into one end of the needle support member 7. The needle support member 7 has a needle support member flow channel 7*a* that connects the raising/lowering axial channel 4*a* and the outside. The needle support member flow channel 7*a* extends in the radial direction of the needle support member 7 and connects the raising/lowering axial channel 4*a* with the outside.

The needle support member 7 has, at the other end thereof, a plurality of needle holding holes that hold the needles 8. The plurality of needle holding holes extend in the axial direction of the spline shaft 4. The plurality of needle holding holes are configured such that the proximal ends of the needles 8 can be inserted therein in the axial direction. In addition, the plurality of needle holding holes are configured such that the proximal ends of the needles 8 can be attached thereto/detached therefrom. Thus, the needle support member 7 can hold the needles 8 in a state in which the axes of the needles 8 are aligned with the axis of the spline shaft 4 by the needle holding holes.

The needles 8 are rod-like members that lift a prescribed semiconductor chip C from among a plurality of semiconductor chips C on the holding sheet S. When viewed in the axial direction, the needles 8 are configured such that the projected areas of the distal ends are smaller than the cross sectional area of the semiconductor chip C to be lifted. In addition, the needles 8 are configured such that the proximal ends can be attached to/detached from the plurality of needle holding holes of the needle support member 7 in the axial direction. The needles 8 are disposed at positions on the needle support member 7 corresponding to the position of the semiconductor chip C to be lifted.

The needle cap 9 is a tubular member that covers the needle support member 7 as well as the needles 8 and that constitutes a stage 9*a* on which the semiconductor chip C is placed. The needle cap 9 is a cylindrical member that has, on one end, the stage 9*a* on which the semiconductor chip C is placed, and that is open on the other end. The stage 9*a* is a planar surface that is perpendicular to the axis of the needle cap 9. The stage 9*a* has a plurality of stage through-holes 9*b* that suction the holding sheet S onto which the semiconductor chip C is attached, or through which the needles 8 pass. The needle cap 9 has, at the other end, an annular fixing flange 9*c* that extend in the radial direction. The fixing flange 9*c* has the needle cap positioning pin groove 9*d*. In addition, the inner diameter of the fixing flange 9*c* is configured such that the needle cap fitting portion 2*e* of the base member 2 can be fitted therein.

In the needle cap 9, the fixing flange 9*c* is fixed to the attachment surface 2*d* of the base member 2. At this time, in the needle cap 9, the needle cap fitting portion 2*e* of the base member 2 is fitted into the annular fixing flange 9*c*. The fixing flange 9*c* into which the needle cap fitting portion 2*e* is fitted determines the position of the needle cap 9 in the X direction and the Y direction with respect to the base member 2. In addition, in the needle cap 9, the needle cap positioning pin 2*f* of the base member 2 is fitted into the needle cap positioning pin groove 9*d*. The needle cap positioning pin groove 9*d* into which the needle cap positioning pin 2*f* is fitted determines the circumferential position of the needle cap 9 with respect to the base member 2.

In addition, the needle cap 9 is fixed to the base member 2 in a state in which the needle support member 7 and the needles 8 are positioned therein. That is, the needle cap 9 covers the needle support member 7 and the needles 8. At this time, the stage through-holes 9*b* of the needle cap 9 overlap with the needles 8 when viewed in the axial direction of the spline shaft 4. In addition, the inside of the needle cap 9 is in communication with the raising/lowering axial channel 4*a* of the spline shaft 4 via the needle support member flow channel 7*a* of the needle support member 7.

In the lifting head 1 configured in this manner, the X-direction and Y-direction positions of the spline nut 3 and the spline shaft 4, as well as the positions thereof about the axis of the spline shaft 4, are determined relative to the base member 2. In addition, in the lifting head 1, the X-direction and Y-direction positions of the needle support member 7 and the needles 8, as well as the positions thereof about the axis of the spline shaft 4, are determined relative to the spline shaft 4. That is, in the lifting head 1, the X-direction and Y-direction positions of the needle support member 7 and the needles 8, as well as the positions thereof about the axis of the spline shaft 4, are determined relative to the base member 2. In addition, in the lifting head 1, the X-direction and Y-direction position of the needle cap 9, as well as the position thereof about the axis of the spline shaft 4, are determined relative to the base member 2. In addition, in the lifting head 1, the spline nut 3, the spline shaft 4, the needle support member 7, the needles 8, and the needle cap 9 are supported by the base member 2. In this manner, the lifting head 1 is configured to be integrally detachable as a single unit that includes the base member 2, the spline nut 3, the spline shaft 4, the needle support member 7, the needles 8, and the needle cap 9.

In addition, in the lifting head 1, the contact member 5 is moved in the axial direction of the spline shaft 4, thereby moving the needle support member 7 and the needles 8, which are fixed to the spline shaft 4, in the axial direction. In the lifting head 1, when the contact member 5 is in the raised position, the needles 8 are inserted into the stage through-holes 9*b* of the needle cap 9. As a result, in the lifting head 1, the distal ends of the needles 8 protrude from the stage 9*a* by a prescribed amount. In the lifting head 1, when the contact member 5 is in the lowered position, the needles 8 come out of the stage through-holes 9*b* of the needle cap 9. As a result, in the lifting head 1, the distal ends of the needles 8 does not protrude from the stage 9*a*.

(Lifting Device 10)

Figure 4:
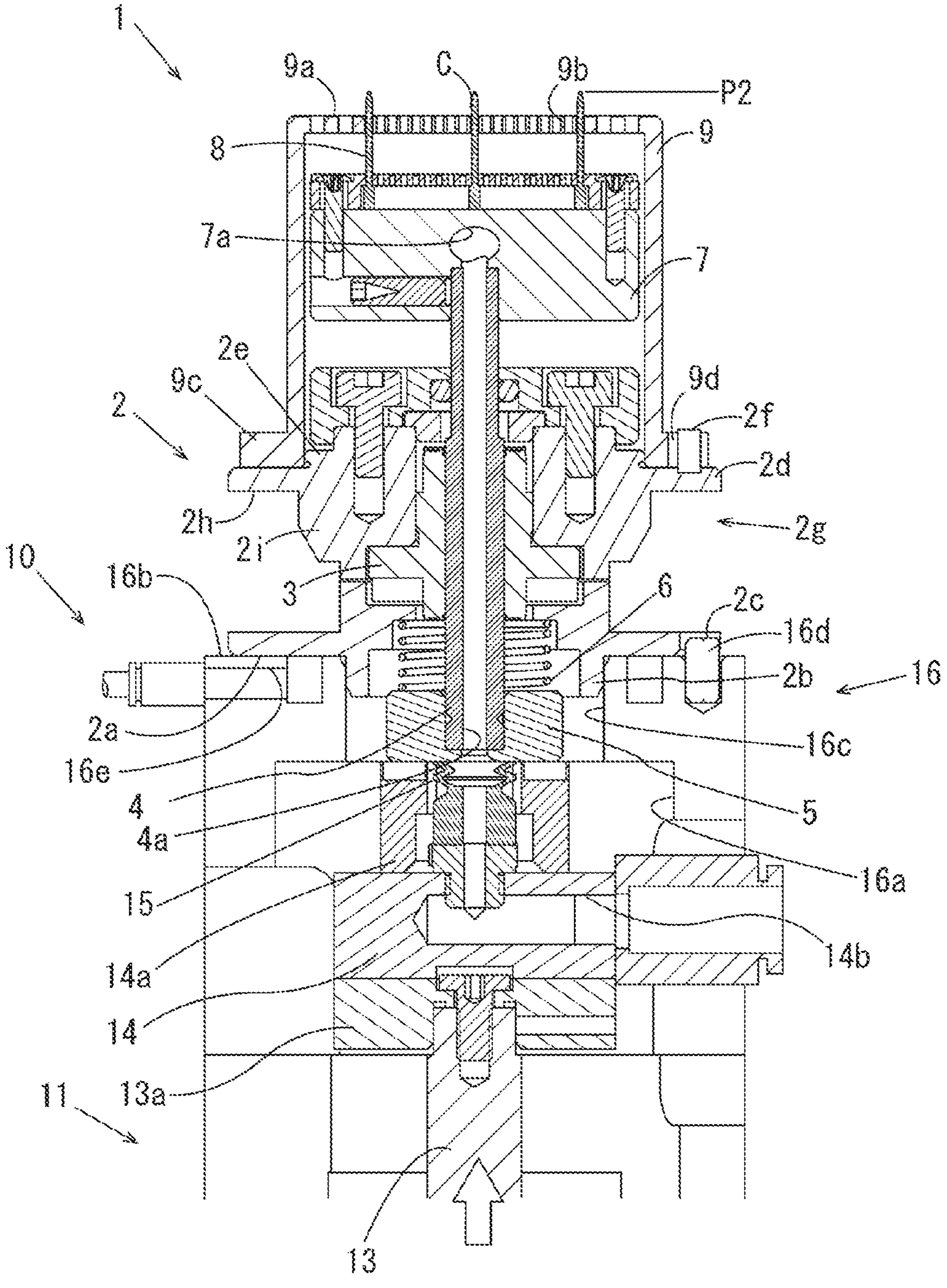
FIG. 4 is a cross-sectional view of the lifting head and the lifting device according to the embodiment of the present disclosure, in a state in which a needle of the lifting head is positioned at a raised position, as viewed from a direction perpendicular to the raising/lowering direction.
Figure 5:
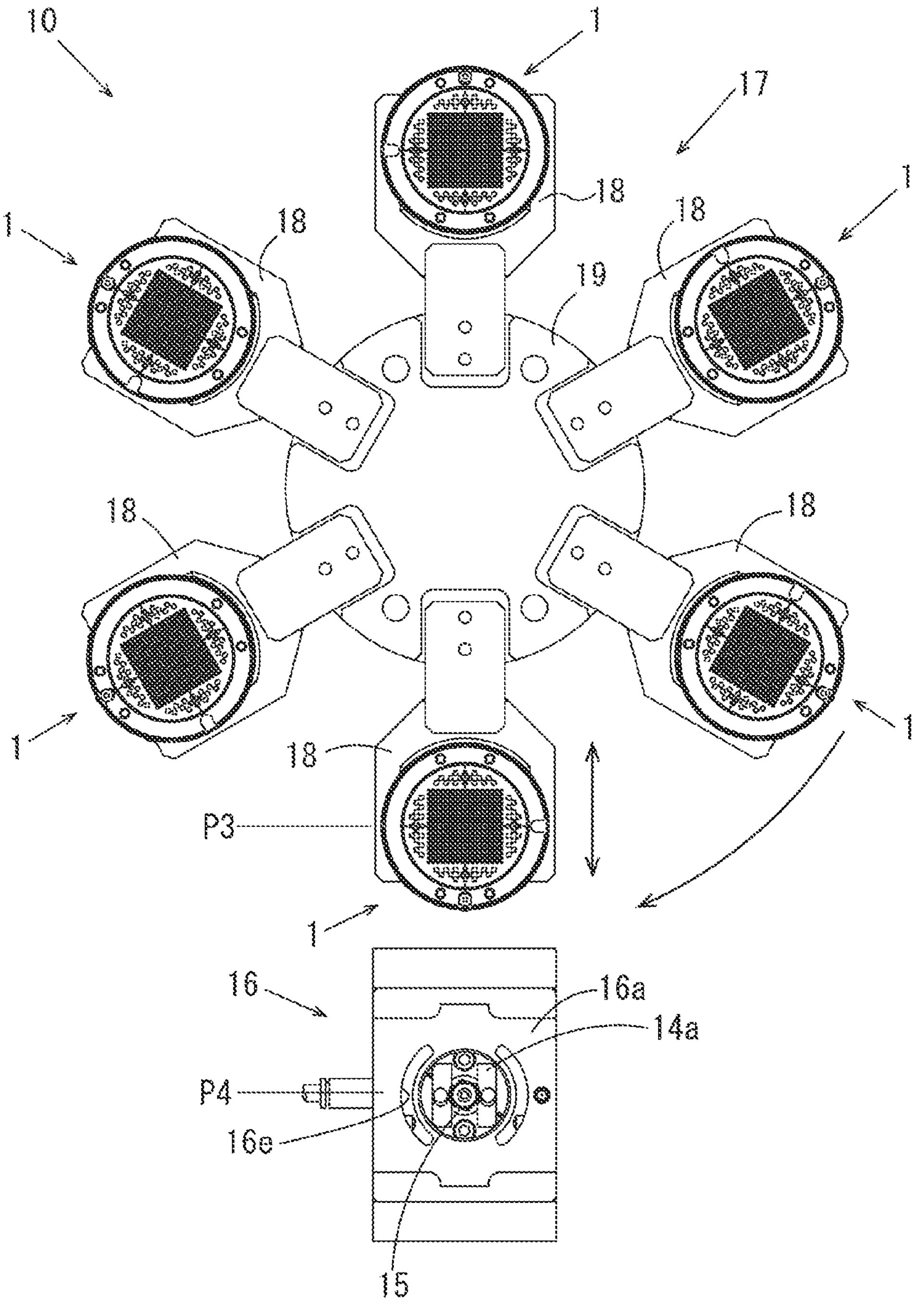
FIG. 5 is a plan view showing a state in which the lifting device according to the embodiment of the present disclosure is holding a plurality of lifting heads with a lifting head replacement mechanism.
Figure 6:
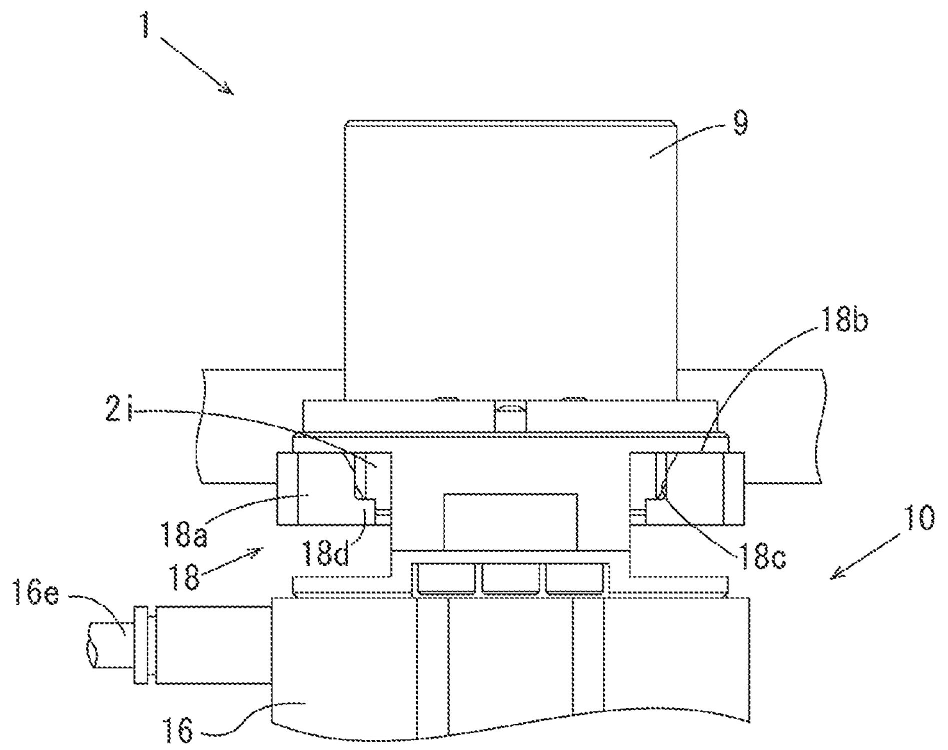
FIG. 6 is a side view showing a state in which the lifting device according to the embodiment of the present disclosure has attached the lifting head to the attachment member.

An exemplary first embodiment of the lifting device that lifts the lifting head 1 according to the present invention will be described next, with reference to FIGS. 2 to 6. FIG. 3 is a cross-sectional view of the lifting head 1 and the lifting device 10, in a state in which the needles 8 of the lifting head 1 are positioned at a lowered position P1, as viewed from a direction perpendicular to the raising/lowering direction. FIG. 4 is a cross-sectional view of the lifting head 1 and the lifting device 10, in a state in which the needles 8 of the lifting head 1 are positioned at a raised position P2, as viewed from a direction perpendicular to the raising/lowering direction. FIG. 5 is a plan view showing a state in which the lifting device 10 is holding a plurality of the lifting heads 1 with a lifting head replacement mechanism 17. FIG. 6 is a side view showing a state in which the lifting device 10 has attached the lifting head 1 to the attachment member 16.

As shown in FIGS. 2 to 4, the lifting device 10 included in the semiconductor manufacturing apparatus is a device for moving the needles 8 of the lifting head 1 in the axial direction. The lifting device 10 comprises the raising/lowering drive mechanism 11, the attachment member 16, and the lifting head replacement mechanism 17.

The raising/lowering drive mechanism 11 is a mechanism for raising and lowering the needles 8 of the lifting head 1. The raising/lowering drive mechanism 11 is provided in an undiagrammed semiconductor manufacturing apparatus. The raising/lowering drive mechanism 11 has an undiagrammed electric motor, which is an actuator, a power conversion device 13, the push-up member 14, and a suction elastic member 15.

The electric motor is a servo motor capable of being rotated at any rotational position, rotational speed, and rotational torque. The electric motor is connected to the power conversion device 13. The electric motor is configured to be capable of transmitting rotational force to the power conversion device 13.

The power conversion device 13 is a device that converts the rotational motion of the electric motor to a raising/lowering motion. The power conversion device 13 converts the rotational motion that is input from the electric motor to a linear motion using a cam mechanism. The power conversion device 13 is arranged with a linearly moving output part 13*a* oriented in the Z direction (up-down direction). The push-up member 14, which moves the contact member 5 of the lifting head 1 upward is fixed to the output part 13*a*. The power conversion device 13 raises the push-up member 14 by the rotation of the electric motor in one direction. In addition, the power conversion device 13 lowers the push-up member 14 by the rotation of the electric motor in the other direction.

The push-up member 14 has support portions 14*a* that come in contact with the contact member 5 of the lifting head 1. The support portions 14*a* are a pair of rectangular block bodies that protrude toward the contact member 5, from the surface of the push-up member 14 on the contact member 5 side. The support portions 14*a* face each other across the center of the push-up member 14. The support portions 14*a* are configured to be capable of supporting the contact member 5.

The push-up member 14 has a second negative pressure passage 14*b*, which is a flow channel for gas. One end of the second negative pressure passage 14*b* has an opening between the pair of block bodies that constitute the support portions 14*a*. That is, one end of the second negative pressure passage 14*b* is open toward the contact member 5 at essentially the center of the surface of the push-up member 14 on the contact member 5 side. In addition, the other end of the second negative pressure passage 14*b* has an opening on a side surface of the push-up member 14 that is parallel to the raising/lowering direction. As a result, the second negative pressure passage 14*b* is configured as a flow channel that connects the side surface of the push-up member 14 that is parallel to the raising/lowering direction with the surface of the push-up member 14 on the contact member 5 side. The opening at the other end of the second negative pressure passage 14*b* is connected to a vacuum source of the undiagrammed semiconductor manufacturing apparatus.

The suction elastic member 15 is a cylindrical member that connects the second negative pressure passage 14*b* with the raising/lowering axial channel 4*a* of the lifting head 1. The suction elastic member 15 is made of a flexible member, such as rubber. The suction elastic member 15 is fixed, with the axial direction thereof oriented in the raising/lowering direction, to the surface of the push-up member 14 on the contact member 5 side. In addition, the suction elastic member 15 is positioned such that, as viewed in the axial direction, the opening at one end of the second negative pressure passage 14*b* is included inside the suction elastic member 15. Thus, the suction elastic member 15 is in communication with the second negative pressure passage 14*b*. Furthermore, the suction elastic member 15 is positioned such that, as viewed in the axial direction, the raising/lowering axial channel 4*a* of the lifting head 1 that is attached to the attachment member 16 is included inside the suction elastic member 15. The end of the suction elastic member 15 on the contact member 5 side protrudes farther toward the contact member 5 side than the support portions 14*a* of the push-up member 14. As a result, the end of the suction elastic member 15 on the contact member 5 side comes in contact with the contact member 5, when the contact member 5 of the lifting head 1 is in contact with the support portions 14*a* of the push-up member 14.

The attachment member 16 is an essentially cuboid member to which the lifting head 1 is attached. The attachment member 16 has a through-hole 16*a* that penetrates from one side surface to the other side surface that face each other. The attachment member 16 is fixed to the end of the power conversion device 13 on the output part 13*a* side, with the one side surface thereof having the opening of the through-hole 16*a* facing the power conversion device 13. That is, the attachment member 16 is fixed to the power conversion device 13 at a position in which the through-hole 16*a* extends in the raising/lowering direction. The output part 13*a* of the power conversion device 13 is inserted into the through-hole 16*a* from the opening on one side surface of the attachment member 16.

The attachment member 16 has, on the other side surface thereof having the opening, a placement surface 16*b* on which the lifting head 1 is placed. The opening of the mounting surface 16*b* is configured to be the base member fitting hole 16*c* into which the base member fitting portion 2*b* of the base member 2 of the lifting head 1 is detachably fitted. In addition, the placement surface 16*b* has the base member positioning pin 16*d* that is fitted into the base member positioning pin groove 2*c* of the base member 2.

The attachment member 16 has the first negative pressure passage 16*e*, which is a flow channel for gas. The first negative pressure passage 16*e* has an opening in the periphery of the base member fitting hole 16*c* on the placement surface 16*b*. An opening at one end of the first negative pressure passage 16*e* is opened at a position that overlaps with the suctioned surface 2*a* of the lifting head 1 that is attached to the attachment member 16, when viewed in the raising/lowering direction. Thus, the opening at one end of the first negative pressure passage 16*e* is covered by the suctioned surface 2*a* when the lifting head 1 is attached to the attachment member 16. In addition, the other end of the first negative pressure passage 16*e* has an opening on a side surface of the attachment member 16 that is parallel to the raising/lowering direction. As a result, the first negative pressure passage 16*e* is configured as a flow channel that connects the placement surface 16*b* with the side surface of the attachment member 16 that is parallel to the raising/lowering direction. The opening at the other end of the first negative pressure passage 16*e* is connected to a vacuum source of the undiagrammed semiconductor manufacturing apparatus.

As shown in FIG. 5, the lifting head replacement mechanism 17 is a mechanism for replacing the lifting head 1 to be attached to the attachment member 16. The lifting head replacement mechanism 17 has a plurality of the replacement arms 18. The plurality of the replacement arms 18 are supported radially at equal intervals by a disk-shaped base part 19. In the present embodiment, the base part 19 supports six of the replacement arms 18. The six replacement arms 18 respectively hold the lifting heads 1 corresponding to different types. The base part 19 is configured to be movable, by an undiagrammed transport device, relative to the attachment member 16 in the X direction and Z direction (raising/lowering direction), as well as in the circumferential direction about the center of the base part 19.

The replacement arms 18 have holding portions 18*a*, which are a pair of rod-like members. The proximal ends of the pair of holding portions 18*a* are connected to each other. The pair of holding portions 18*a* have upper surfaces 18*b* that can come in contact with the replacement arm contact surfaces 2*h* of the base members 2 of the lifting heads 1. In addition, the pair of holding portions 18*a* have inner side surfaces 18*c* that are parallel to each other and face each other. The pair of holding portions 18*a* are arranged between the opposing inner side surfaces 18*c* with a gap therebetween, into which the base member 2 can be inserted. Furthermore, the pair of holding portions 18*a* each has, at the distal end thereof, a pawl portion 18*d* that projects toward the opposing holding portion 18*a*.

The replacement arms 18 are configured to be able to hold the base members 2 of the lifting heads 1 between the pair of holding portions 18*a*. The replacement arms 18 can bring the upper surfaces 18*b* in contact with the replacement arm contact surfaces 2*h* to move the lifting heads 1 in the raising/lowering direction (up-down direction). In addition, the replacement arms 18 bring the inner side surfaces 18*c* in contact with the projecting portions 2*i* of the base members 2, thereby determining the X direction and Y direction positions of the lifting heads 1, as well as the circumferential position about the center of the lifting heads 1 with respect to the replacement arms 18. The replacement arms 18 can bring the inner side surfaces 18*c* in contact with the projecting portions 2*i* of the base members 2 to move the replacement arms 18 in the circumferential direction. In addition, the replacement arms 18 can bring the pawl portions 18*d* in contact with the projecting portions 2*i* of the base members 2 to restrict the movement of the lifting heads 1 in the radial direction relative to the replacement arms 18.

The attachment/detachment of the lifting head 1 by the lifting device 10 will be described next, with reference to FIGS. 2 to 4. It is assumed that the lifting head 1 is not attached to the lifting device 10. In addition, it is assumed that the lifting head 1 is supported, as a single unit, by the replacement arm 18 of the head replacement mechanism 17.

As shown in FIGS. 2 and 3, when attaching the lifting head 1 to the lifting device 10, the lifting head replacement mechanism 17 of the lifting device 10 rotates the base part 19 using an undiagrammed transport device, and moves, from among the lifting heads 1 respectively held by the plurality of the replacement arms 18, a selected lifting head 1 to a standby position P3 (refer to FIG. 5). Subsequently, the lifting head replacement mechanism 17 moves the base part 19 toward the lifting device 10 to a replacement position P4 (refer to FIG. 5). Subsequently, the lifting head replacement mechanism 17 lowers the base part 19 and attaches the lifting head 1 that is supported by the replacement arm 18 to the attachment member 16 of the lifting device 10. After lowering the base part 19 so that the pawl portions 18*d* of the replacement arm 18 separate from the projecting portions 2*i* of the base member 2, the lifting head replacement mechanism 17 moves the replacement arm 18 to the standby position P3.

In the lifting head 1 that is supported by the replacement arm 18, the base member fitting portion 2*b* of the base member 2 is fitted into the base member fitting hole 16*c* of the attachment member 16 with the lowering of the base part 19 by the lifting head replacement mechanism 17. As a result, the X direction and the Y direction positions the lifting head 1 are determined relative to the attachment member 16. At the same time, in the lifting head 1, the base member positioning pin 16*d* of the attachment member 16 is fitted into the base member positioning pin groove 2*c* of the base member 2. As a result, the position of the lifting head 1 is determined relative to the attachment member 16 in the circumferential direction about the center of the base member fitting hole 16*c*.

The lifting head 1 is supported by the attachment member 16 in a state in which the suctioned surface 2*a* of the base member 2 is in contact with the placement surface 16*b* of the attachment member 16. At this time, the suctioned surface 2*a* covers the opening of the first negative pressure passage 16*e* of the placement surface 16*b*. Further, in the lifting head 1, the compression spring 6 presses the contact member 5 against the push-up member 14 of the raising/lowering drive mechanism 11. The contact member 5 comes in contact with the support portions 14*a* of the push-up member 14. In addition, the contact member 5 is pressed against the suction elastic member 15 protruding farther upward than the support portions 14*a*. The suction elastic member 15 is compressed by the contact member 5 toward the raising/lowering drive mechanism 11. At this time, the opening of the raising/lowering axial channel 4*a* of the spline shaft 4 that penetrates the contact member 5 is included inside the suction elastic member 15. Thus, the raising/lowering axial channel 4*a* is in communication with the second negative pressure passage 14*b* via the suction elastic member 15, which is in communication with the second negative pressure passage 14*b* of the lifting device 10.

Subsequently, the lifting device 10 reduces the pressure inside the first negative pressure passage 16*e* to a negative pressure using the vacuum source. In the lifting head 1, the suctioned surface 2*a*, which covers the opening of the first negative pressure passage 16*e*, is gripped by the suction force from the first negative pressure passage 16*e*. The suctioned surface 2*a* is pressed against the placement surface 16*b* by the suction force. The position of the lifting head 1 with respect to the placement surface 16*b* is maintained by frictional force generated between the suctioned surface 2*a* and the placement surface 16*b* due to the suction force. The lifting head 1 may be configured to be fixed by an engagement member that is pressed by a spring, or the like, in addition to the fixing by the suction force.

Subsequently, the lifting device 10 reduces the pressure inside the second negative pressure passage 14*b* to a negative pressure using the vacuum source. The suction elastic member 15 that communicates with the second negative pressure passage 14*b* is in close contact with the contact member 5 of the lifting head as a result of the reduction in the internal pressure. In the lifting head 1, the pressure inside the raising/lowering axial channel 4*a* that is in communication with the suction elastic member 15 becomes negative. Furthermore, in the lifting head 1, the interior of the needle cap 9 is suctioned via the needle support member flow channel 7*a* of the needle support member 7, which is in communication with the raising/lowering axial channel 4*a*. As a result, in the lifting head 1, suction force that suctions the holding sheet S (refer to FIG. 3), which holds the semiconductor chip C (refer to FIG. 3), is generated in the plurality of stage through-holes 9*b* of the stage 9*a* of the needle cap 9.

As shown in FIG. 4, the lifting device 10 raises and lowers the needles 8 of the lifting head 1 with the raising/lowering drive mechanism 11, in a state in which the lifting head 1 is gripped onto the attachment member 16 by the suction force of the first negative pressure passage 16*e*. At this time, the suction elastic member 15 that connects the second negative pressure passage 14*b* with the raising/lowering axial channel 4*a* of the lifting head 1, is in close contact with the contact member 5 of the lifting head 1 by the negative pressure of the second negative pressure passage 14*b*. Furthermore, the contact member 5 is pressed against the support portions 14*a* of the push-up member 14 by the compression spring 6 of the lifting head 1, and thus does not separate from the push-up member 14 regardless of the raising or lowering of the push-up member 14. Thus, the suctioned state of the suction elastic member 15 with respect to the contact member 5 is not affected by the operation of the lifting head 1.

As shown in FIG. 3, when moving the holding sheet S (refer to FIG. 3), which is holding the semiconductor chip C (refer to FIG. 3), the lifting device 10 raises the pressure inside the second negative pressure passage 14*b* to atmospheric pressure. With the rise in the internal pressure, the suction elastic member 15, which is a flexible member, is put in a state of losing the gripping of the contact member 5 due to negative pressure. The suction elastic member 15 maintains the state of being in contact with the contact member 5 due to the elastic force of the flexible member. Thus, when the pressure inside the second negative pressure passage 14*b* is made negative again in the lifting device 10, the suction elastic member 15 comes in close contact with the contact member 5 at the same position. As a result, the lifting device 10 is able to maintain the communication state, realized by the suction elastic member 15, between the second negative pressure passage 14*b* and the raising/lowering axial channel 4*a* of the lifting head 1, even if the pressure in the second negative pressure passage 14*b* fluctuates.

On the other hand, the first negative pressure passage 16*e* is a passage of a separate system, independent of the second negative pressure passage 14*b*, and thus is not affected by fluctuations in the pressure in the second negative pressure passage 14*b*. That is, the suction force of the lifting head 1 imparted by the first negative pressure passage 16*e* does not fluctuate due to fluctuations in the pressure in the second negative pressure passage 14*b*. Thus, it is possible to maintain the position of the lifting head 1 with respect to the attachment member 16.

As shown in FIG. 3, when removing the lifting head 1 from the lifting device 10, the lifting device 10 increases the pressure inside the second negative pressure passage 14*b* to atmospheric pressure. With the rise in the internal pressure, the suction elastic member 15, which is a flexible member, is put in a state of not gripping the contact member 5 of the lifting head. The suction elastic member 15 maintains the state of being in contact with the contact member 5 due to the elastic force of the flexible member. In addition, the lifting head 1 is put in a state in which the interior of the needle cap 9 is not suctioned.

Subsequently, the lifting device 10 raises the pressure inside the first negative pressure passage 16*e* to atmospheric pressure. The suctioned surface 2*a* of the lifting head 1, which covers the opening of the first negative pressure passage 16*e*, will no longer be gripped. The lifting head 1 is pressed against the placement surface 16*b* of the attachment member 16 by gravity alone. The lifting head 1 is switched to a state of being movable with respect to the placement surface 16*b*.

As shown in FIG. 5, the lifting head replacement mechanism 17 uses an undiagrammed transport device to move the replacement arm 18, which is in the standby position P3, together with the base part 19, toward the lifting device 10 to the replacement position P4.

As shown in FIG. 6, the lifting head replacement mechanism 17 raises the base part 19 and brings the replacement arm 18 in contact with the lifting head 1, which is attached to the attachment member 16 of the lifting device 10. The replacement arm 18 removes the lifting head 1 from the attachment member 16 in a state in which the inner side surfaces 18*c* are in contact with the projecting portions 2*i* of the base member 2, and the upper surfaces 18*b* are in contact with the replacement arm contact surface 2*h* of the base member 2. In the lifting head 1, the suctioned surface 2*a* of the base member 2 separates from the placement surface 16*b* of the attachment member 16 as the base part 19 of the lifting head replacement mechanism 17 rises. Accordingly, in the lifting head 1, the contact member 5 separates from the suction elastic member 15 and the support portions 14*a* of the push-up member 14, and the base member fitting portion 2*b* comes out of the base member fitting hole 16*c* of the attachment member 16. Furthermore, the lifting head replacement mechanism 17 moves the replacement arm 18 to the standby position P3 in a state of holding the lifting head 1 that is removed from the attachment member 16.

The lifting head 1 configured in this manner is configured as a single unit in which the base member 2 supports the other members. In addition, in the lifting head 1, the base member 2 is gripped onto the attachment member 16 by the suction force of the first negative pressure passage 16*e* of the attachment member 16 of the lifting device 10. Thus, the lifting head 1 does not move relative to the attachment member 16. Furthermore, in the lifting head, the inside of the needle cap 9 is suctioned by the suction force of the second negative pressure passage 14*b* of the raising/lowering drive mechanism 11 of the lifting device 10. That is, the lifting head 1 is configured such that the base member 2 is gripped, and the inside of the needle cap 9 is suctioned, by the suction forces of different negative pressure passages. Therefore, fluctuations in the negative pressure inside the needle cap 9 of the lifting head 1 does not affect the gripped state of the base member 2.

In addition, the compression spring 6 constantly applies a force to press the contact member 5 of the lifting head 1 against the raising/lowering drive mechanism 11. Thus, even when raised or lowered by the raising/lowering drive mechanism 11, the contact member 5 does not separate from the push-up member 14 of the raising/lowering drive mechanism 11. That is, the lifting head 1 can prevent leakage from the connection portion of the suction elastic member 15 which connects the second negative pressure passage 14*b* and the raising/lowering axial channel 4*a* of the spline shaft 4. In addition, the compression spring 6 applies a force in a direction in which the base member 2 separates from the attachment member 16.

In addition, the lifting head 1 is transported in a state in which the movement thereof in the X direction, the Y direction, and the Z direction (raising/lowering direction) with respect to the replacement arm 18 is restricted by the replacement arm contact surface 2*h* and the projecting portions 2*i*, provided in the arm engagement portion 2*g* of the base member 2. Thus, the lifting head 1 does not move relative to the replacement arm 18 during transportation. As a result, the lifting head 1 is able to maintain the positions of the needles 8 positioned relative to the lifting device 10 in a readily detachable state.

The lifting device 10 according to the present embodiment grips the suctioned surface 2*a* of the base member 2 of the lifting head 1 with the suction force of the first negative pressure passage 16*e* of the attachment member 16. Furthermore, the lifting device 10 suctions the inside of the needle cap 9 in the lifting head 1 with the second negative pressure passage 14*b* of the raising/lowering drive mechanism 11. Therefore, the lifting device 10 grips the lifting head 1 and suctions the inside of the lifting head 1 through different passages, so neither is affected by fluctuations in the negative pressure.

In addition, in the lifting device 10, when the base member 2 of the lifting head 1 is attached to the attachment member 16, the second negative pressure passage 14*b* of the raising/lowering drive mechanism 11 and the raising/lowering axial channel 4*a* of the spline shaft 4 in the lifting head 1 are placed in communication with each other by the suction elastic member 15. The suction elastic member 15 is made of an elastic body, such as rubber, and therefore comes in close contact with the spline shaft 4 or the contact member 5 of the lifting head 1 by the suction force in the second negative pressure passage 14*b*. The suction elastic member 15 separates from the lifting head 1 by making the pressure inside the second negative pressure passage 14*b* positive. Thus, the lifting device 10 can prevent leakage from the connection portion between the second negative pressure passage 14*b* and the raising/lowering axial channel 4*a*.

In addition, in the lifting device 10, the plurality of the replacement arms 18 of the lifting head replacement mechanism 17 respectively hold the lifting heads 1 corresponding to different types of chips. The lifting device 10 is able to automatically attach/detach, using the replacement arms 18, any one of the lifting heads 1 respectively held by the plurality of replacement arms 18, to/from the attachment member 16. As described above, the lifting device 10 can adjust the pressure of the first negative pressure passage 16*e* and the second negative pressure passage 14*b* to maintain the positions of the needles 8 positioned relative to the lifting device 10 in a readily detachable state.

Other Embodiments

In all of the embodiments described above, the raising/lowering axial channel 4*a* of the spline shaft 4 in the lifting head 1 is in communication with the second negative pressure passage 14*b* via the suction elastic member 15 of the lifting device 10. However, the suction elastic member 15 may be provided in the lifting head 1. When the suction elastic member 15 is attached to the attachment member 16 of the lifting device 10, the suction elastic member 15 is pressed against the push-up member 14 of the raising/lowering drive mechanism 11. In addition, the lifting head 1 and the lifting device 10 may each have the suction elastic member 15.

If the lifting head 1 has the suction elastic member 15, the second negative pressure passage 14*b* of the raising/lowering drive mechanism 11 and the raising/lowering axial channel 4*a* of the raising/lowering shaft is placed in communication with each other by the suction elastic member 15. The suction elastic member 15 is made of an elastic body, such as rubber, and thus is in close contact with the raising/lowering drive mechanism 11 by the suction force of the second negative pressure passage 14*b*. Thus, the suction elastic member 15 can prevent leakage from the connection portion between the second negative pressure passage 14*b* and the raising/lowering axial channel 4*a*. On the other hand, the suction elastic member 15 separates from the raising/lowering drive mechanism 11 by making the pressure inside the second negative pressure passage 14*b* positive. As a result, it is possible to maintain the positions of the needles 8 positioned relative to the lifting device 10 in a readily detachable state.

In the embodiments described above, the base member 2 of the lifting head 1 is positioned relative to the attachment member 16 by the base member positioning pin 16*d*. In addition, the needle cap 9 of the lifting head 1 is positioned relative to the base member 2 by the needle cap positioning pin 2*f*. However, it is not necessary for the positioning of the base member relative to the attachment member and the positioning of the needle cap 9 relative to the base member to be achieved with positioning pins.

In addition, in the embodiments described above, the lifting device 10 converts the rotational motion of the electric motor to a linear motion using the raising/lowering drive mechanism 11. However, the lifting device may be configured to raise and lower the lifting head 1 with a linear actuator, such as a linear motor.

In addition, in the embodiments described above, the replacement arm 18 of the lifting head replacement mechanism 17 holds the lifting head 1 with the holding portions 18*a*, which are a pair of rod-like members. However, the replacement arm may hold the lifting head using other forms and structures.

In addition, in the embodiments described above, the lifting device 10 is configured to be capable of replacing the lifting head 1 in accordance with type of the semiconductor chip C (refer to FIG. 3) using the lifting head replacement mechanism 17. However, it is not necessary for the lifting device 10 to be provided with a lifting head replacement mechanism.

Embodiments of the present invention have been described above, but the embodiments described above are merely examples for implementing the present invention. Therefore, the present invention is not limited to the embodiments described above, and may be implemented by modifying the embodiments described above as appropriate to the extent of not departing from the essence of the present invention.

DESCRIPTIONS OF THE REFERENCE SYMBOLS

1 Lifting head
2 Base member
2*a* Suctioned surface
2*b* Base member fitting portion
2*c* Base member positioning pin groove
2*d* Attachment surface
2*e* Needle cap fitting portion
2*f* Needle cap positioning pin
2*g* Arm engagement portion
2*h* Replacement arm contact surface
2*i* Projecting portion
3 Spline nut
4 Spline shaft
4*a* Raising/lowering axial channel
5 Contact member
6 Compression spring
7 Needle support member
7*a* Needle support member flow channel
8 Needle
9 Needle cap
9*a* Stage
9*b* Stage through-hole
9*c* Fixing flange
10 Lifting device

11 Raising/lowering drive mechanism
13 Power conversion device
13*a* Output part
14 Push-up member
14*a* Support portion
14*b* Second negative pressure passage
15 Suction elastic member
16 Attachment member
16*a* Through-hole
16*b* Placement surface
16*c* Base member fitting hole
16*d* Base member positioning pin
16*e* First negative pressure passage
17 Lifting head replacement mechanism
18 Replacement arm
18*a* Holding portion
18*b* Upper surface
18*c* Inner side surface
19 Base part

The invention claimed is:

1. A lifting head configured to lift, with a needle, at least one of a plurality chips attached to a holding sheet, in a lifting device of a semiconductor manufacturing apparatus, the lifting head comprising:

a base member that is configured to be detachably attached with respect to an attachment member of the lifting device, and that has a suctioned surface that is configured to be gripped onto the attachment member;

a raising/lowering shaft that is supported by the base member in a state of being movable in an axial direction as well as being non-rotatable about an axis, and that has a raising/lowering axial channel that communicates from one end to the other end in the axial direction;

a contact member that is fixed to the one end of the raising/lowering shaft in a state in which the raising/lowering axial channel is in communication with an outside, and that is configured to contact with, from a raising/lowering direction, a push-up member of a raising/lowering drive mechanism of the lifting device;

a needle support member that is fixed to the other end of the raising/lowering shaft in a state in which the raising/lowering axial channel is in communication with the outside, and that supports the needle in the axial direction so as to be detachable; and a needle cap that has a tubular shape and that has, at one end thereof, a stage on which the holding sheet is configured to be placed and to which is provided a through-hole through which the needle is inserted, the needle cap being fixed, at the other end thereof, to the base member so that, while the needle support member and the needle are located therein, the through-hole overlaps with the needle when viewed in the axial direction;

the suctioned surface of the base member being configured to be gripped by a suction force of a first negative pressure passage of the attachment member in a state of being positioned on the attachment member, and while the contact member contacts with the raising/lowering drive mechanism, an inside of the needle cap is configured to be suctioned by a suction force of a second negative pressure passage of the raising/lowering drive mechanism via the raising/lowering axial channel.

2. The lifting head according to claim 1, further comprising a tubular suction elastic member that is fixedly coupled to one of the raising/lowering shaft and the contact member so as to communicate with the raising/lowering axial channel, the suction elastic member being configured to communicate with the second negative pressure passage while the contact member contacts with a push-up member of the raising/lowering drive mechanism.

3. The lifting head according to claim 2, further comprising a pressing elastic member that is configured to press the contact member toward the push-up member of the raising/lowering drive mechanism, the contact member being configured to be pressed against the push-up member of the raising/lowering drive mechanism by the pressing elastic member.

4. The lifting head according to claim 2, wherein the base member has an arm engagement portion that is configured to engage with a replacement arm of the lifting device.

5. A lifting device configured to raise/lower the needle of the lifting head according to claim 2, comprising:

an attachment member to which the lifting head is configured to be detachably attached;

a raising/lowering drive mechanism that is configured to raise/lower the contact member of the lifting head; and a lifting head replacement mechanism that is configured to attach/detach the lifting head to/from the attachment member, the attachment member having a first negative pressure passage that is configured to be suctioned by a vacuum source to apply suction force to the suctioned surface of the base member while the base member of the lifting head is attached to the attachment member, and the raising/lowering drive mechanism having a push-up member that is configured to push up the contact member of the lifting head and a second negative pressure passage that is configured to be suctioned by a vacuum source to apply suction force to an inside of the needle cap of the lifting head via the raising/lowering axial channel of the lifting head while the contact member of the lifting head contacts with the push-up member.

6. The lifting head according to claim 1, further comprising a pressing elastic member that is configured to press the contact member toward the push-up member of the raising/lowering drive mechanism, the contact member being configured to be pressed against the push-up member of the raising/lowering drive mechanism by the pressing elastic member.

7. The lifting head according to claim 6, wherein the base member has an arm engagement portion that is configured to engage with a replacement arm of the lifting device.

8. A lifting device configured to raise/lower the needle of the lifting head according to claim 6, comprising:

an attachment member to which the lifting head is configured to be detachably attached;

a raising/lowering drive mechanism that is configured to raise/lower the contact member of the lifting head; and a lifting head replacement mechanism that is configured to attach/detach the lifting head to/from the attachment member, the attachment member having a first negative pressure passage that is configured to be suctioned by a vacuum source to apply suction force to the suctioned surface of the base member while the base member of the lifting head is attached to the attachment member, and the raising/lowering drive mechanism having a push-up member that is configured to push up the contact member of the lifting head and a second negative pressure passage that is configured to be suctioned by a vacuum source to apply suction force to an inside of the needle cap of the lifting head via the raising/lowering axial channel of the lifting head while the contact member of the lifting head contacts with the push-up member.

9. The lifting head according to claim 1, wherein the base member has an arm engagement portion that is configured to engage with a replacement arm of the lifting device.

10. A lifting device configured to raise/lower the needle of the lifting head according to claim 9, comprising:

an attachment member to which the lifting head is configured to be detachably attached;

a raising/lowering drive mechanism that is configured to raise/lower the contact member of the lifting head; and a lifting head replacement mechanism that is configured to attach/detach the lifting head to/from the attachment member, the attachment member having a first negative pressure passage that is configured to be suctioned by a vacuum source to apply suction force to the suctioned surface of the base member while the base member of the lifting head is attached to the attachment member, and the raising/lowering drive mechanism having a push-up member that is configured to push up the contact member of the lifting head and a second negative pressure passage that is configured to be suctioned by a vacuum source to apply suction force to an inside of the needle cap of the lifting head via the raising/lowering axial channel of the lifting head while the contact member of the lifting head contacts with the push-up member.

11. A lifting device configured to raise/lower the needle of the lifting head according to claim 1, comprising:

an attachment member to which the lifting head is configured to be detachably attached;

a raising/lowering drive mechanism that is configured to raise/lower the contact member of the lifting head; and a lifting head replacement mechanism that is configured to attach/detach the lifting head to/from the attachment member, the attachment member having a first negative pressure passage that is configured to be suctioned by a vacuum source to apply suction force to the suctioned surface of the base member while the base member of the lifting head is attached to the attachment member, and the raising/lowering drive mechanism having a push-up member that is configured to push up the contact member of the lifting head and a second negative pressure passage that is configured to be suctioned by a vacuum source to apply suction force to the inside of the needle cap of the lifting head via the raising/lowering axial channel of the lifting head while the contact member of the lifting head contacts with the push-up member.

12. The lifting device according to claim 11, further comprising a tubular suction elastic member that is fixedly coupled to an opening of the second negative pressure passage to communicate with the second negative pressure passage, the suction elastic member being configured to communicate with the raising/lowering axial channel of the lifting head while the contact member of the lifting head contacts with the push-up member.

13. The lifting device according to claim 12, wherein the lifting head replacement mechanism has a plurality of replacement arms that are respectively configured to hold lifting heads, one of the replacement arms holding a selected lifting head being configured to attach the selected lifting head onto the attachment member, and another one of the replacement arms corresponding to a lifting head that has been attached to the attachment member being configured to remove the lifting head from the attachment member.

14. The lifting device according to claim 11, wherein the lifting head replacement mechanism has a plurality of replacement arms that are respectively configured to hold lifting heads, one of the replacement arms holding a selected lifting head being configured to attach the selected lifting head onto the attachment member, and another one of the replacement arms corresponding to a lifting head that has been attached to the attachment member being configured to remove the lifting head from the attachment member.

* * * * *